US008626329B2

(12) United States Patent
Dickson et al.

(10) Patent No.: US 8,626,329 B2
(45) Date of Patent: Jan. 7, 2014

(54) PRODUCT ASSEMBLY SYSTEM AND CONTROL SOFTWARE

(75) Inventors: Craig Alexander Dickson, Arbroath (GB); Ronald Arron McGill, Arbroath (GB)

(73) Assignee: AGR Automation Ltd., Arbroath (GB)

( * ) Notice: Subject to any disclaimer, the term of this patent is extended or adjusted under 35 U.S.C. 154(b) by 917 days.

(21) Appl. No.: 12/623,303

(22) Filed: Nov. 20, 2009

(65) Prior Publication Data
US 2011/0125307 A1 May 26, 2011

(51) Int. Cl.
| G06F 19/00 | (2011.01) |
| G06F 17/00 | (2006.01) |
| B65G 17/00 | (2006.01) |
| B65G 37/00 | (2006.01) |
| B65G 15/00 | (2006.01) |
| H01L 21/67 | (2006.01) |
| G06Q 10/08 | (2012.01) |
| A21B 1/46 | (2006.01) |
| B65B 43/52 | (2006.01) |

(52) U.S. Cl.
CPC .......... *H01L 21/67276* (2013.01); *G06Q 10/08* (2013.01); *A21B 1/46* (2013.01); *B65B 43/52* (2013.01)
USPC ........... 700/112; 700/229; 700/230; 198/797; 198/343.1; 198/343.2; 198/620

(58) Field of Classification Search
None
See application file for complete search history.

(56) References Cited

U.S. PATENT DOCUMENTS

| 3,592,333 | A | * | 7/1971 | Sullivan et al. ............... 198/349 |
| 3,616,088 | A | * | 10/1971 | Weir ............................. 156/542 |
| 3,682,338 | A | * | 8/1972 | Von Gal et al. ............ 414/796.2 |
| 3,690,433 | A | * | 9/1972 | Buldini ....................... 198/345.3 |
| 3,709,383 | A | * | 1/1973 | Jennings et al. ............... 414/279 |
| 3,717,290 | A | * | 2/1973 | Bentley et al. .................... 225/2 |
| 3,746,189 | A | * | 7/1973 | Burch et al. .................. 414/273 |
| 3,786,943 | A | * | 1/1974 | Coppel ......................... 414/273 |

(Continued)

FOREIGN PATENT DOCUMENTS

| DE | 44 27 477 A1 | 2/1995 |
| DE | 195 32 281 A1 | 3/1997 |

(Continued)

OTHER PUBLICATIONS

Thompson, P.; Hartmann, J.; Feikert, E.; and Buttrick, J., "Flex Track for Use in Production", 2005, SAE International, AEROFAST Conference, Paper No. 2005-01-3318.*

(Continued)

*Primary Examiner* — Mohammad Ali
*Assistant Examiner* — Kelvin Booker
(74) *Attorney, Agent, or Firm* — Jenkins, Wilson, Taylor & Hunt, P.A.

(57) ABSTRACT

An improved assembly, test, packaging and/or processing system and a control system, each of which may be expanded or reduced in size, capability and/or capacity on a modular basis to suit or adapt to a number of different applications. The product assembly, test, packaging and/or processing system comprises a number of modules which are assembled and arranged as required. Pallets move between stations on the modules along track portions which cooperate with track portions on adjacent modules so other modules can be added without affecting the movement of the pallets. When those modules are added or removed, or when stations are added or removed, corresponding controllers in the control system are also added or removed.

18 Claims, 7 Drawing Sheets

(56) References Cited

U.S. PATENT DOCUMENTS

| | | | |
|---|---|---|---|
| 3,805,942 A * | 4/1974 | Auernhammer | 198/341.03 |
| 3,854,889 A * | 12/1974 | Lemelson | 29/33 P |
| 3,880,299 A * | 4/1975 | Zollinger et al. | 414/273 |
| 4,058,270 A * | 11/1977 | Simmons et al. | 242/420 |
| 4,205,740 A * | 6/1980 | Hammond | 104/135 |
| 4,256,221 A * | 3/1981 | Lain | 198/345.3 |
| 4,273,053 A * | 6/1981 | Gibbs | 104/168 |
| 4,385,685 A * | 5/1983 | Sticht | 700/112 |
| 4,472,783 A * | 9/1984 | Johnstone et al. | 700/182 |
| 4,502,585 A * | 3/1985 | Sticht | 198/345.3 |
| 4,515,264 A * | 5/1985 | Sticht | 198/375 |
| 4,532,869 A * | 8/1985 | Kondo et al. | 104/252 |
| 4,591,991 A * | 5/1986 | Sticht | 700/227 |
| 4,668,151 A * | 5/1987 | Oberoi et al. | 198/465.3 |
| 4,704,568 A * | 11/1987 | Beck et al. | 318/687 |
| 4,715,286 A * | 12/1987 | Parker et al. | 104/172.3 |
| 4,718,539 A * | 1/1988 | Fukuwatari et al. | 198/619 |
| 4,728,383 A * | 3/1988 | Kaller et al. | 156/285 |
| 4,731,151 A * | 3/1988 | Kaller et al. | 156/556 |
| 4,766,993 A * | 8/1988 | Kita et al. | 198/619 |
| 4,771,785 A * | 9/1988 | Duer | 600/415 |
| 4,976,025 A * | 12/1990 | Aldridge et al. | 29/563 |
| 5,178,255 A * | 1/1993 | Carlson | 198/346.1 |
| 5,271,139 A * | 12/1993 | Sticht | 29/430 |
| 5,301,788 A * | 4/1994 | Hironaka et al. | 198/346.1 |
| 5,318,167 A * | 6/1994 | Bronson et al. | 198/577 |
| 5,321,874 A * | 6/1994 | Mills et al. | 29/33 P |
| 5,368,425 A * | 11/1994 | Mills et al. | 409/235 |
| 5,368,539 A * | 11/1994 | Mills et al. | 483/1 |
| 5,477,597 A * | 12/1995 | Catania et al. | 29/34 B |
| 5,661,892 A * | 9/1997 | Catania et al. | 29/525.02 |
| 5,738,484 A * | 4/1998 | Taylor | 414/788.1 |
| 5,857,413 A * | 1/1999 | Ward | 104/48 |
| 5,927,464 A * | 7/1999 | Clark et al. | 198/349 |
| 5,946,449 A * | 8/1999 | Dickerson et al. | 700/260 |
| 5,984,503 A * | 11/1999 | Strickland et al. | 700/95 |
| 6,191,507 B1 * | 2/2001 | Peltier et al. | 310/12.02 |
| 6,279,724 B1 * | 8/2001 | Davis | 198/465.2 |
| 6,381,977 B1 * | 5/2002 | Austin, Jr. | 62/259.1 |
| 6,468,065 B1 * | 10/2002 | Butler | 425/195 |
| 6,516,234 B2 * | 2/2003 | Kamiguchi et al. | 700/20 |
| 6,535,786 B1 * | 3/2003 | Duemler | 700/112 |
| 6,540,502 B2 * | 4/2003 | Butler | 425/453 |
| 6,554,119 B2 * | 4/2003 | Oldford et al. | 198/345.3 |
| 6,561,103 B2 * | 5/2003 | Peck | 104/88.06 |
| 6,640,962 B2 * | 11/2003 | Richardson | 198/580 |
| 6,651,799 B1 * | 11/2003 | Rice et al. | 198/345.3 |
| 6,654,663 B1 * | 11/2003 | Jokela | 700/230 |
| 6,708,385 B1 * | 3/2004 | Lemelson | 29/563 |
| 6,758,320 B1 * | 7/2004 | Tegel | 198/345.1 |
| 6,912,443 B2 * | 6/2005 | Duemler | 700/112 |
| 6,988,079 B1 * | 1/2006 | Or-Bach et al. | 705/28 |
| 7,114,607 B2 * | 10/2006 | Stone | 198/343.1 |
| 7,123,988 B2 * | 10/2006 | Russell et al. | 700/217 |
| 7,128,196 B2 * | 10/2006 | Oldford et al. | 198/345.3 |
| 7,197,374 B2 * | 3/2007 | Silverbrook et al. | 700/215 |
| RE39,747 E * | 7/2007 | Peltier et al. | 310/12.11 |
| 7,243,476 B2 * | 7/2007 | Schneider | 53/399 |
| 7,263,409 B2 * | 8/2007 | LeVasseur et al. | 700/228 |
| 7,278,813 B2 * | 10/2007 | Davis et al. | 414/416.03 |
| 7,343,660 B1 * | 3/2008 | Lemelson | 29/563 |
| 7,380,213 B2 * | 5/2008 | Pokorny et al. | 715/764 |
| 7,415,428 B2 * | 8/2008 | Garwood | 705/26.5 |
| 7,456,593 B1 * | 11/2008 | Floresta et al. | 318/135 |
| 7,458,454 B2 * | 12/2008 | Mendenhall | 198/463.2 |
| 7,490,710 B1 * | 2/2009 | Weskamp et al. | 198/345.3 |
| 7,520,376 B2 * | 4/2009 | Bar | 198/465.1 |
| 7,621,392 B2 * | 11/2009 | Langsdorf et al. | 198/832 |
| 7,653,974 B2 * | 2/2010 | Mischler et al. | 29/33 P |
| 7,693,757 B2 * | 4/2010 | Zimmerman | 705/28 |
| 7,826,920 B2 * | 11/2010 | Stevens et al. | 700/215 |
| 7,882,438 B2 * | 2/2011 | Markham et al. | 715/736 |
| 7,926,644 B2 * | 4/2011 | Mendenhall | 198/463.2 |
| 7,937,298 B2 * | 5/2011 | Shah | 705/28 |
| 7,991,505 B2 * | 8/2011 | Lert et al. | 700/214 |
| 8,086,345 B2 * | 12/2011 | Pandit et al. | 700/217 |
| 8,086,347 B2 * | 12/2011 | Pandit et al. | 700/227 |
| 8,116,905 B2 * | 2/2012 | Pandit et al. | 700/216 |
| 8,155,783 B2 * | 4/2012 | Pandit et al. | 700/225 |
| RE43,887 E * | 1/2013 | Langsdorf et al. | 198/832 |
| 2002/0065571 A1 * | 5/2002 | Kamiguchi et al. | 700/96 |
| 2003/0041770 A1 * | 3/2003 | Peck | 105/29.1 |
| 2003/0057060 A1 * | 3/2003 | Richardson | 198/580 |
| 2003/0093178 A1 * | 5/2003 | Russell et al. | 700/217 |
| 2003/0158795 A1 * | 8/2003 | Markham et al. | 705/28 |
| 2003/0209404 A1 * | 11/2003 | Davis et al. | 198/345.3 |
| 2004/0185156 A1 * | 9/2004 | Garwood | 426/398 |
| 2004/0197172 A1 * | 10/2004 | Hansl et al. | 414/281 |
| 2005/0043850 A1 * | 2/2005 | Stevens et al. | 700/213 |
| 2005/0080520 A1 * | 4/2005 | Kline et al. | 701/1 |
| 2005/0115797 A1 * | 6/2005 | Stone | 198/339.1 |
| 2005/0149226 A1 * | 7/2005 | Stevens et al. | 700/214 |
| 2005/0149414 A1 * | 7/2005 | Schrodt et al. | 705/29 |
| 2005/0263369 A1 * | 12/2005 | Mendenhall | 198/370.01 |
| 2006/0090332 A1 * | 5/2006 | Taban | 29/748 |
| 2006/0113168 A1 * | 6/2006 | Bar | 198/867.01 |
| 2006/0116899 A1 * | 6/2006 | Lax et al. | 705/1 |
| 2006/0149407 A1 * | 7/2006 | Markham et al. | 700/108 |
| 2006/0156785 A1 * | 7/2006 | Mankame et al. | 72/413 |
| 2007/0106413 A1 * | 5/2007 | Russell et al. | 700/113 |
| 2007/0185616 A1 * | 8/2007 | Murray et al. | 700/245 |
| 2007/0219873 A1 * | 9/2007 | Fischburg | 705/26 |
| 2007/0276535 A1 * | 11/2007 | Haag | 700/217 |
| 2008/0067035 A1 * | 3/2008 | Keith et al. | 198/345.3 |
| 2008/0077511 A1 * | 3/2008 | Zimmerman | 705/28 |
| 2008/0103944 A1 * | 5/2008 | Hagemann et al. | 705/28 |
| 2008/0228316 A1 * | 9/2008 | Stevens et al. | 700/217 |
| 2008/0255968 A1 * | 10/2008 | Heinrichs | 705/28 |
| 2008/0288961 A1 * | 11/2008 | Shah | 719/316 |
| 2008/0296130 A1 * | 12/2008 | Langsdorf et al. | 198/794 |
| 2009/0216370 A1 * | 8/2009 | Pandit et al. | 700/226 |
| 2009/0216438 A1 * | 8/2009 | Shafer | 701/210 |
| 2009/0216603 A1 * | 8/2009 | Pandit et al. | 705/9 |
| 2009/0234493 A1 * | 9/2009 | Pandit et al. | 700/215 |
| 2009/0234494 A1 * | 9/2009 | Pandit et al. | 700/216 |
| 2009/0234495 A1 * | 9/2009 | Pandit et al. | 700/217 |
| 2009/0276081 A1 * | 11/2009 | Pandit et al. | 700/214 |
| 2009/0276084 A1 * | 11/2009 | Pandit et al. | 700/230 |
| 2009/0276264 A1 * | 11/2009 | Pandit et al. | 705/7 |
| 2009/0276337 A1 * | 11/2009 | Pandit et al. | 705/28 |
| 2009/0289043 A1 * | 11/2009 | Kilibarda | 219/136 |
| 2010/0017347 A1 * | 1/2010 | Hagemann et al. | 705/400 |
| 2010/0076591 A1 * | 3/2010 | Lert, Jr. | 700/216 |
| 2010/0228562 A1 * | 9/2010 | Luciano et al. | 705/2 |
| 2010/0247275 A1 * | 9/2010 | Karlen et al. | 414/286 |
| 2010/0276255 A1 * | 11/2010 | Staunton et al. | 198/750.1 |
| 2010/0276256 A1 * | 11/2010 | Kleinikkink et al. | 198/793 |
| 2011/0046775 A1 * | 2/2011 | Bailey et al. | 700/224 |
| 2011/0101590 A1 * | 5/2011 | Mankame et al. | 269/309 |
| 2011/0106296 A1 * | 5/2011 | Stevens et al. | 700/217 |
| 2011/0125307 A1 * | 5/2011 | Dickson et al. | 700/112 |
| 2011/0282631 A1 * | 11/2011 | Poling et al. | 702/188 |
| 2011/0320028 A1 * | 12/2011 | Penick et al. | 700/112 |
| 2013/0167751 A1 * | 7/2013 | Rosenwinkel | 104/118 |

FOREIGN PATENT DOCUMENTS

| | | | | |
|---|---|---|---|---|
| DE | 201 20 576 U1 | 2/2003 | | |
| EP | 418931 A2 * | 3/1991 | | B23Q 1/00 |
| FR | 2 564 075 A | 11/1985 | | |
| FR | 2 568 861 A1 | 2/1986 | | |
| GB | 2153767 A | 8/1985 | | |
| TW | 200821241 A | 8/1996 | | |

OTHER PUBLICATIONS

Search Report under Section 17 for Application No. GB0922070.8 (Feb. 17, 2010).

* cited by examiner

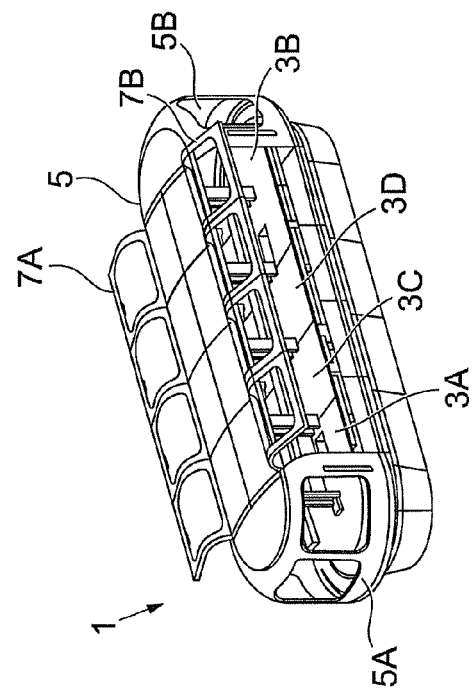
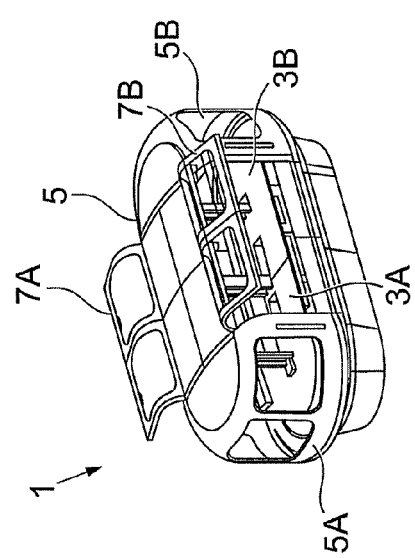
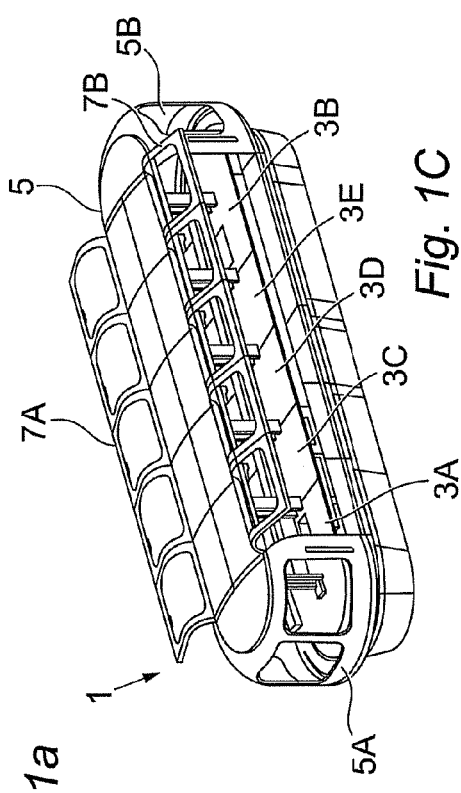

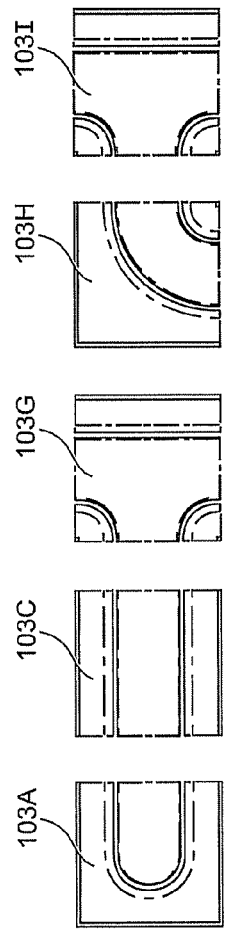
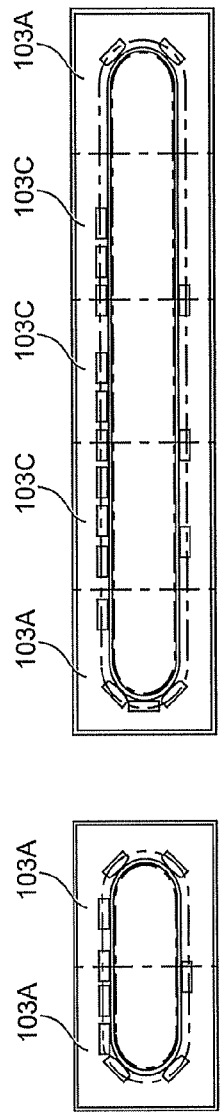
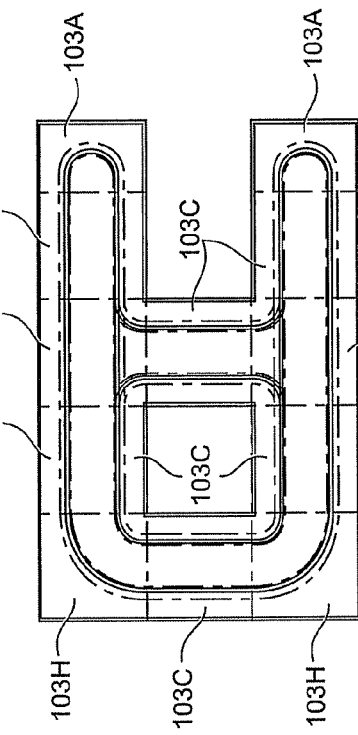

PRODUCT ASSEMBLY SYSTEM AND CONTROL SOFTWARE

FIELD OF THE INVENTION

The present invention relates to an improved product assembly system. In particular, a product assembly system which may be expanded or reduced in size, capability and/or capacity on a modular basis, and control software that permits said modular modification and is itself modularly expandable, to suit a number of different applications.

BACKGROUND OF THE INVENTION

Automated assembly, test, packaging and/or processing systems are widely used in industry for high throughput applications. Examples of such applications are the assembly and testing of electronic circuits, parts handling, and the assembly and testing of medical devices.

However, conventional systems lack expansion capability and flexibility and are extremely expensive, which makes investing in a new piece of equipment not only a difficult financial decision but also a difficult operational decision because it is generally very time and labour (and hence cost) intensive to modify an existing system to perform new, improved or even modified procedures.

Traditionally most machines built for automation assembly are designed to perform a specific function and either made redundant when the product line stops or need to be reconstituted at great cost.

One such system known to the applicant provides integrated guarding, which is clearly beneficial from a safety point of view, but lacks any capacity to expand the system either in hardware or in terms of the control software which governs the operation of the system; that is, at least without requiring extensive re-programming of the control software. The system is also irreversible; i.e. it is not possible to move a workpiece in any direction other than forwards (on to the next step in the process). This system is typical of existing automated assembly, test, packaging and/or test systems, and the kinds of systems whose limitations the present invention seeks to obviate and mitigate.

SUMMARY OF THE INVENTION

According to a first aspect of the present invention, there is provided an improved system for product assembly, test, packaging and/or processing, the system comprising:
  at least one pallet on which to locate a product within the system;
  a plurality of modules, each of said modules comprising a work surface upon which to mount one or more product assembly, test, packaging or processing stations; and
  a track on which the at least one pallet is mounted and along which the pallet is moved from one tool to another;
  wherein a first of the modules comprises a first portion of the track removeably connected to a second module comprising a second portion of the track, the track portions cooperating to allow the at least one pallet to move therebetween.

Preferably, the system further comprises a plurality of linear motors and a plurality of pallets, each pallet having a magnet mounted and positioned thereon to interact with the linear motors to form a linear drive which moves the pallets along the track.

Preferably, the pallet comprises one or more bearings to aid movement of the pallet along the track. Preferably, each pallet comprises one or more bearings, the bearings and the track interacting such that the movement of the pallets follows the track.

Most preferably, each pallet comprises at least two bearings positioned on opposite sides of the track and engaging said opposite sides of the track.

Preferably, the system further comprises a position controller to control the position of the plurality of pallets by controlling the interaction between the linear motors and the magnets mounted on said plurality of pallets.

Alternatively, the system comprises one or more lead screw systems to move the at least one pallet.

Preferably, each of the one or more pallets comprises a radio frequency identification (RFID) tag.

Most preferably, the position controller controls the distance between successive pallets to provide a variable pitch width.

Preferably, the system further comprises a third module comprising a third portion of the track, whereby the third module is added to the system by removeably connecting the third module to one or both of the first and second modules such that one or both of the first and second portions of track cooperate with the third portion of track to allow the at least one pallet to move between respective modules.

Most preferably, the first, second and/or third modules comprise one or more linear motors aligned with an adjacent linear motor of the same or a connected module to allow continuous movement of the at least one pallet from one portion of the track to the next.

Preferably, the track forms a continuous loop to allow the at least one pallet to loop repeatedly around the system. Optionally, the system comprises at least one return module to return the at least one pallet to an opposite side of the previous module. Optionally, the return module comprises a u-shaped track portion and a mechanical return wheel to interact with a pressure foot fitted to the rear of the at least one pallet and drive the at least one pallet around the u-shaped track portion. Alternatively, the return module comprises a u-shaped track portion and at least one curved linear motor.

Yet further alternatively, the return module comprises a u-shaped track portion and a plurality of tangentially arranged straight linear motors.

Preferably, each of the modules comprises an integrated moveable guard, the integrated moveable guard of each module adapted to cooperate with the integrated moveable guard of an adjoining module to provide the system with a continuous moveable guard. Optionally, the guard is automatically locked in a closed position when the system is in operation. Preferably, the guard comprises a gull-wing door.

Preferably, the work surfaces comprise adjustable station mounting rails to mount one or more product assembly, test, packaging or processing tools thereon.

According to a second aspect of the present invention, there is provided a control system for controlling a product assembly, test, packaging and/or processing system such as the system of the first aspect, the control system comprising:
  a position controller to control the position of at least one pallet within the system; and
  at least one controller to control the operation of each station on each module of the system;
  wherein integration of an additional station is achieved by:
  adapting the controller to control the additional station or adding another controller to the control system to control the additional station; and
  providing the position controller with position information relating to the additional station.

Preferably, the control system comprises a programmable logic controller having a plurality of controllers, said controllers including the position controller and at least one station controller. Most preferably, the programmable logic controller is adapted to control an additional station by adding an additional corresponding station controller. Alternatively, the control system comprises a suitably programmed computer.

Preferably, the control system comprises a plurality of inactive station controllers, wherein integration of an additional station is achieved by activating at least one of said inactive station controllers.

Alternatively, the one or more controllers provide an interface with one or more localised station controllers.

Optionally, the control system creates a station controller based on a set of station parameters received by the control system.

Preferably, the control system comprises a human computer interface to display information relating to the system, and to receive commands and/or parameters relating to the operation of the system.

According to a third aspect of the present invention, there is provided a computer program product containing one or more sequences of machine-readable instructions, the instructions being adapted to cause one or more processors to provide the control system of the second aspect.

BRIEF DESCRIPTION OF THE FIGURES

The present invention will now be described by way of example only and with reference to the accompanying figures in which:

FIG. 1 illustrates (a) a two module arrangement, (b) a four module arrangement, and (c) a five module arrangement of an assembly, test, packaging and/or processing system in accordance with an aspect of the present invention;

FIG. 2 illustrates in schematic form (a) a selection of modules which may be employed to move pallets in particular directions, (b) a basic module arrangement, (c) a "racetrack" module arrangement, and (d) an example of a more complex module configuration achievable using the various modules illustrated in FIG. 2(a), in accordance with an aspect of the present invention;

DETAILED DESCRIPTION OF THE INVENTION

With reference to the accompanying figures, there is presented a modular product assembly system as described in detail below.

The present invention provides a unique chassis platform on which to build automated assembly, test, packaging and/or processing systems. This uniqueness stems from the modular way in which the system can be expanded. See, for example, FIG. 1 which shows a system (1) comprising (a) two modules (3A,3B), (b) four modules (3A,3B,3C,3D) and (c) five modules (3A,3B,3C,3D,3E). Clearly, any number of modules may be joined to achieve a desired line length (e.g. to accommodate a desired number of pallets/workpieces) or to provide adequate surface area on which to mount a desired number of stations/tools.

The system (1) comprises an enclosure (5) formed by end enclosure portions (5A,5B) and hinged gull-wing type guards (7A,7B) formed by connecting guards corresponding to individual modules. When the system (1) is operating, the guards (7A,7B) may be locked in place to prevent harm to or interference by an operator or other person. One or more of the individual guards may be selectively disconnectable from the other guard(s) to allow an operator access to a particular station, even while the system is operating. This may allow routine maintenance to be carried out on a deactivated station, or allow access to a manually operated station.

FIG. 2(a) illustrates a variety of schematic module configurations including a return module (103A) comprising which two linear portions of track and a u-shaped portion of track which allows a pallet mounted thereon to return in the direction from which it has arrived, along the opposite side of the module (and subsequent modules). Two such return modules (103A) may be connected as shown in the basic configuration illustrated in FIG. 2(b) which corresponds to the system illustrated in FIG. 1(a). The straight module (103C) is relatively self explanatory, allowing two-way movement along opposite sides of the module (that is, two way movement on one side as well as two way movement on the opposite side). FIG. 2(c) illustrates a "racetrack" configuration of several straight modules (103C) and a return module (103A) at either end, similar to the system illustrated in FIG. 1(c). A corner module (103H) allows a pallet to change direction by 90 degrees and permits perpendicular modular expansion of a system. The lane change module (103I) permits switching between the function of a tee module (103G) and a straight module (103C), and therefore permits pallets to be passed straight on or sent off at a 90 degree angle to a connected module. FIG. 2(d) is an example of a more complex module configuration which may be achieved using the various modules illustrated in FIG. 2(a).

Figure 3:
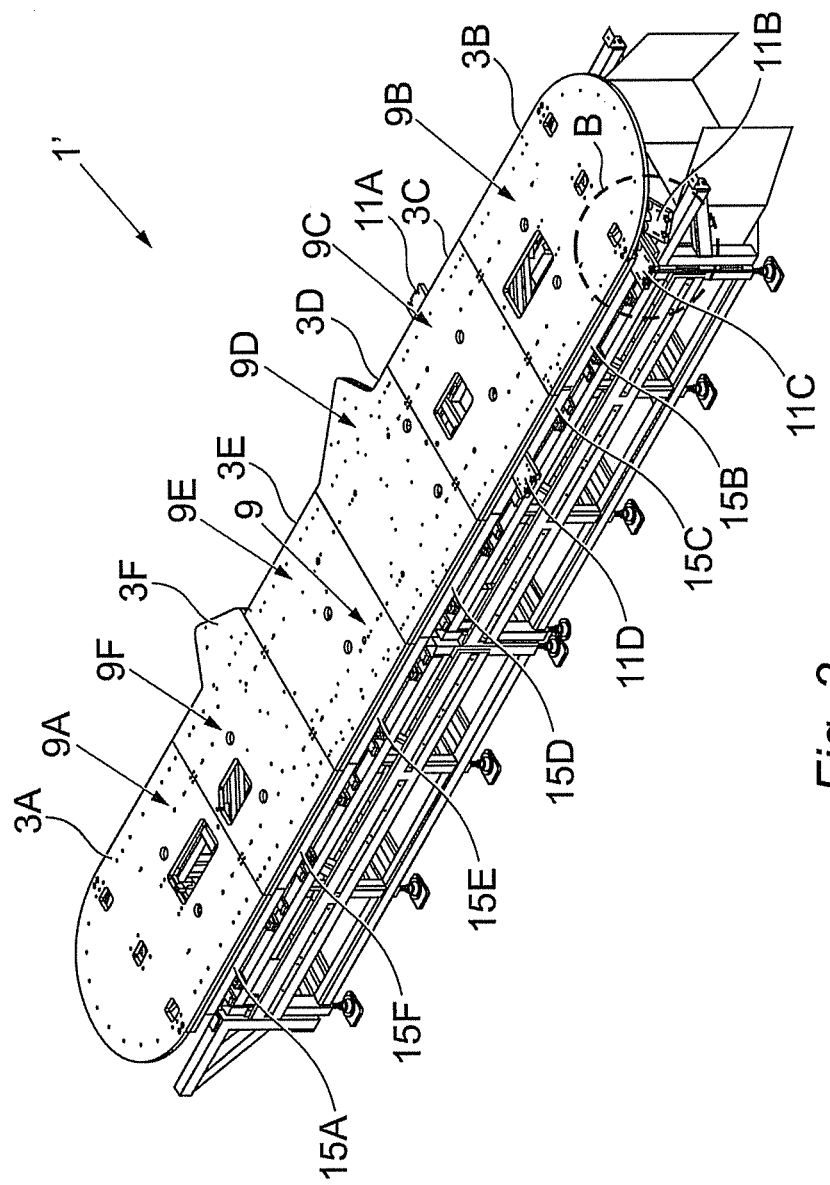
FIG. 3 illustrates in schematic form an exemplary embodiment of a six module system in accordance with an aspect of the present invention, comprising two return modules and four straight modules.
Figure 6:
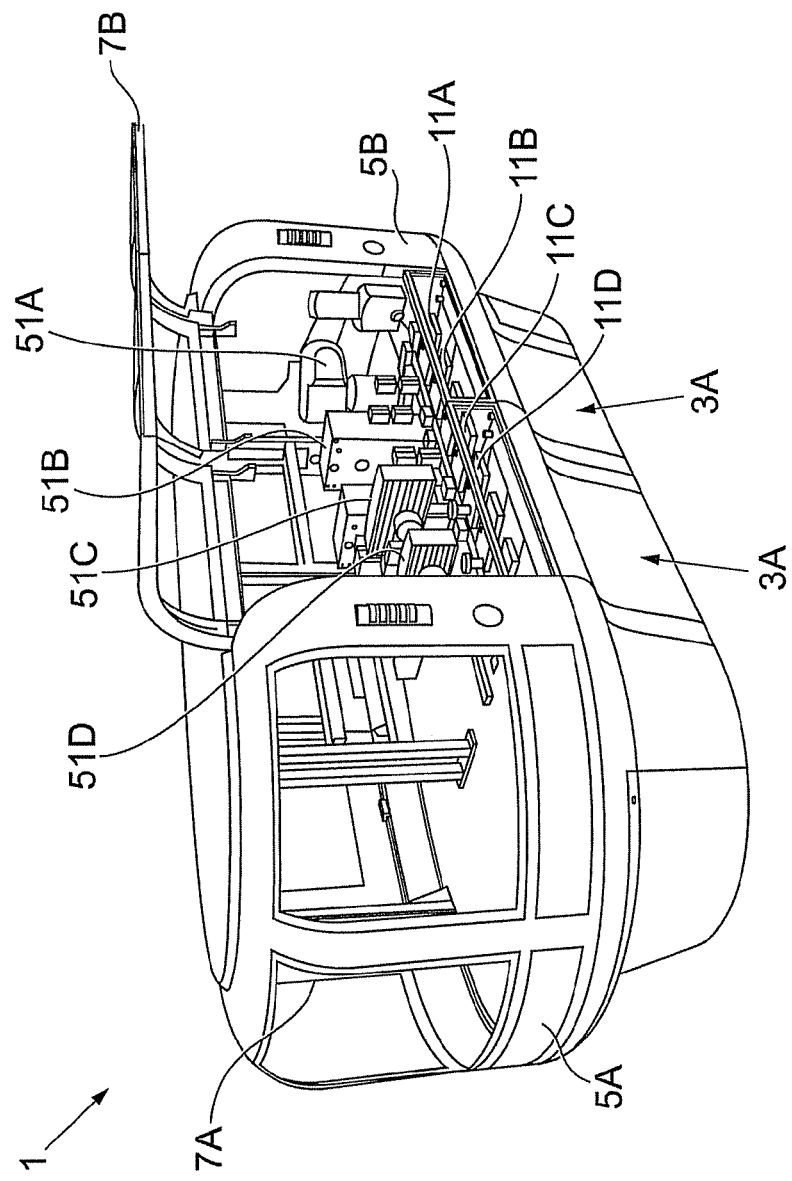
FIG. 6 illustrates in schematic form a system comprising a number of tooling stations in accordance with an aspect of the present invention.

FIG. 3 illustrates an exemplary embodiment of an elongated six module system (1') which comprises two return modules (3A,3B) and four straight modules (3C,3D,3E,3F). Each of the modules provides a work surface (9A-9F) which, in cooperation with the adjoining modules provides a large, continuous work surface (9) upon which a variety of tools (as illustrated in FIG. 6, description to follow) may be fixedly mounted. Four pallets (11A,11B,11C,11D) circulate around the periphery of the work surface (9) under the control of a position controller as described in further detail below. Of course any number of pallets that can be accommodated around the periphery may be employed.

Each of the modules (3A-3F) can be seen to comprise a linear motor (15A-15F) extending along one side. Each module also comprises a corresponding linear motor extending along the opposite side (not visible in the perspective view presented but mirroring that which is visible). The linear motor of one module (e.g. 3E) can be seen to align with the linear motors of the previous (where applicable, e.g. 3F) and subsequent (again, where applicable; e.g. 3D) modules. This allows continuous movement of the pallet around the system but also means that if one module (e.g. 3D) is removed, the remaining spaced modules (e.g. 3E and 3C) may be brought together whereupon the respective linear motors (15E and 15C) will align and continuous movement may resume.

Figure 4:
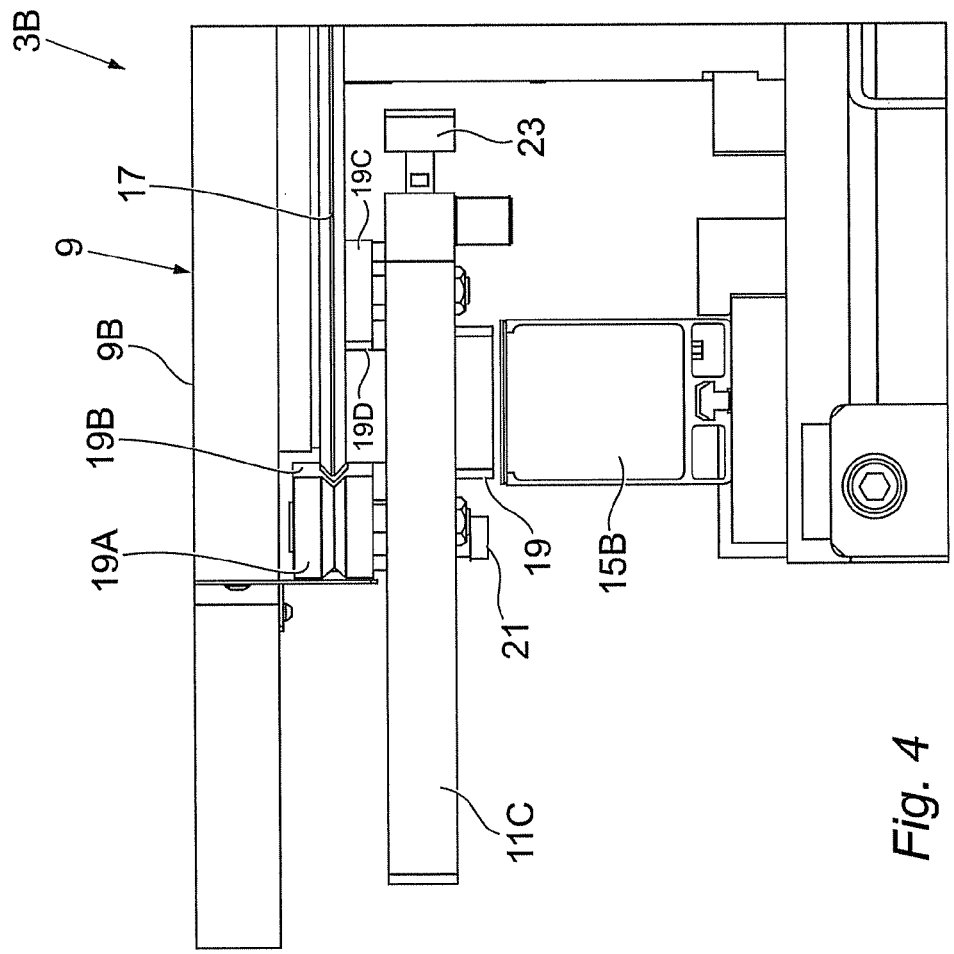
FIG. 4 illustrates in schematic form a portion of an end-on view of the system illustrated in FIG. 3 which shows how the pallet is mounted on and propelled along the track, in accordance with an aspect of the present invention.

The drive system by which the pallets (e.g. 11C) are moved around the system (1) will now be described with reference to FIG. 4. FIG. 4 presents and end-on view of the area generally indicated by reference letter B in FIG. 3. The pallet (11C) is mounted on the track (17) by way of four bearings (19A-19D). Two bearings (19A,19B) are located on the outside of the track and comprise channels into which the track (17) locates. Likewise, two bearings (19C,19D) are located on the inside of the track (17) and also have channels into which the track (17) locates. The pallet (11C) is thereby attached to the track (17) but able to move freely along the track (17) in either direction.

On the underside of the pallet (11C) is mounted a permanent magnet (19). The arrangement of the system (1) is such that the permanent magnet (19) is suspended directly above the linear motor (15B) and sufficiently close to allow the linear motor (15B) to exert a force (the force having at least a vector component parallel to a longitudinal axis of the linear motor) on the permanent magnet (19) and hence propel the pallet (11C) along the track (17).

In an alternative embodiment, one or more of the linear motors are replaced with a number of lead screw systems.

Also mounted on the pallet is a radio frequency identification (RFID) tag (21). This tag (21) uniquely identifies the pallet (11C) not only within the system (1) but potentially within other systems which the pallet (11C) may be transferred to.

Figure 5:
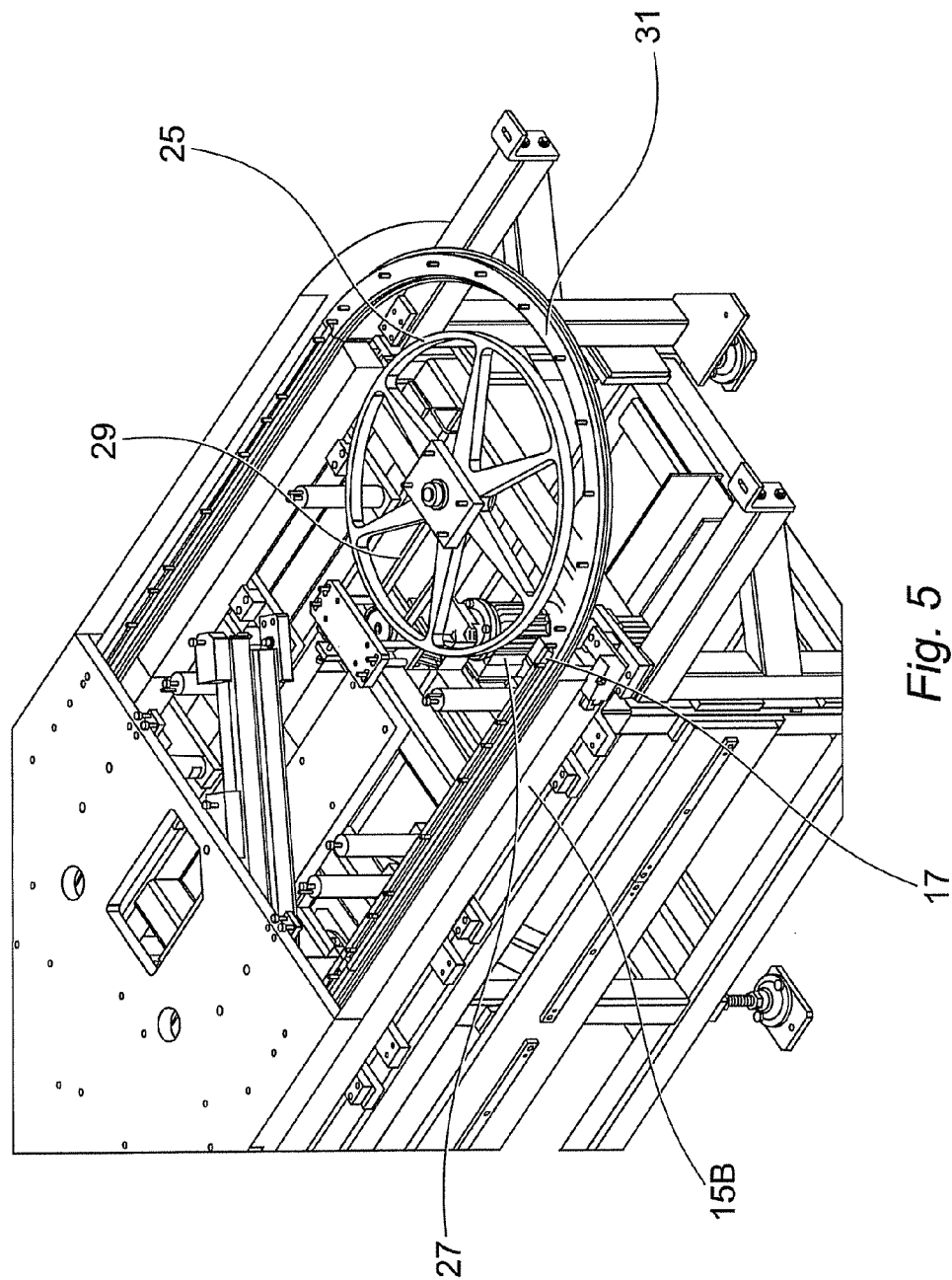
FIG. 5 illustrates in schematic form a cut-away view of the return module shown in FIG. 3, in accordance with an aspect of the present invention.

To enable the pallet (11C) to travel along a u-shaped portion (31) of the track (17), the pallet (11C) is provided with a pressure foot (23) which engages a mechanical return wheel (25) as shown in FIG. 5. The wheel (25) is rotated by driving a motor (27) to which it is directly mounted or connected by a drive belt (29). When a pallet (11C) reaches the end of linear motor (15B), the pressure foot (23) engages an outer surface of the wheel (25) such that rotation of the wheel (25) causes the pallet (11C) to travel around the u-shaped portion (31) of the track until the pallet (11C) reaches the opposite linear motor (105B, visible in cut-away) at which time the linear motor (15B) can resume control of the motion of the pallet (11C).

In an alternative embodiment, pallets may be moved around the u-shaped portion by employing one or more curved linear motors, or a number of tangentially arranged straight linear motors.

The illustration of the system (1) presented in FIG. 6 shows a two module (3A,3B) configuration, with one guard (7A) closed and the other guard (7B) open to allow inspection of tools (51A-51D). Each of said tools (including a six axis pick and place robot, by way of example; 51A) may be controlled by a dedicated programmable logic controller system or a suitably programmed PC. Furthermore, the position of each of the pallets (e.g. 11A-11D) is controlled by a dedicated position controller, the dedicated position controller itself controlled by the overall software control system which is preferably a programmable logic controller or alternatively a PC-based control system.

Figure 7:
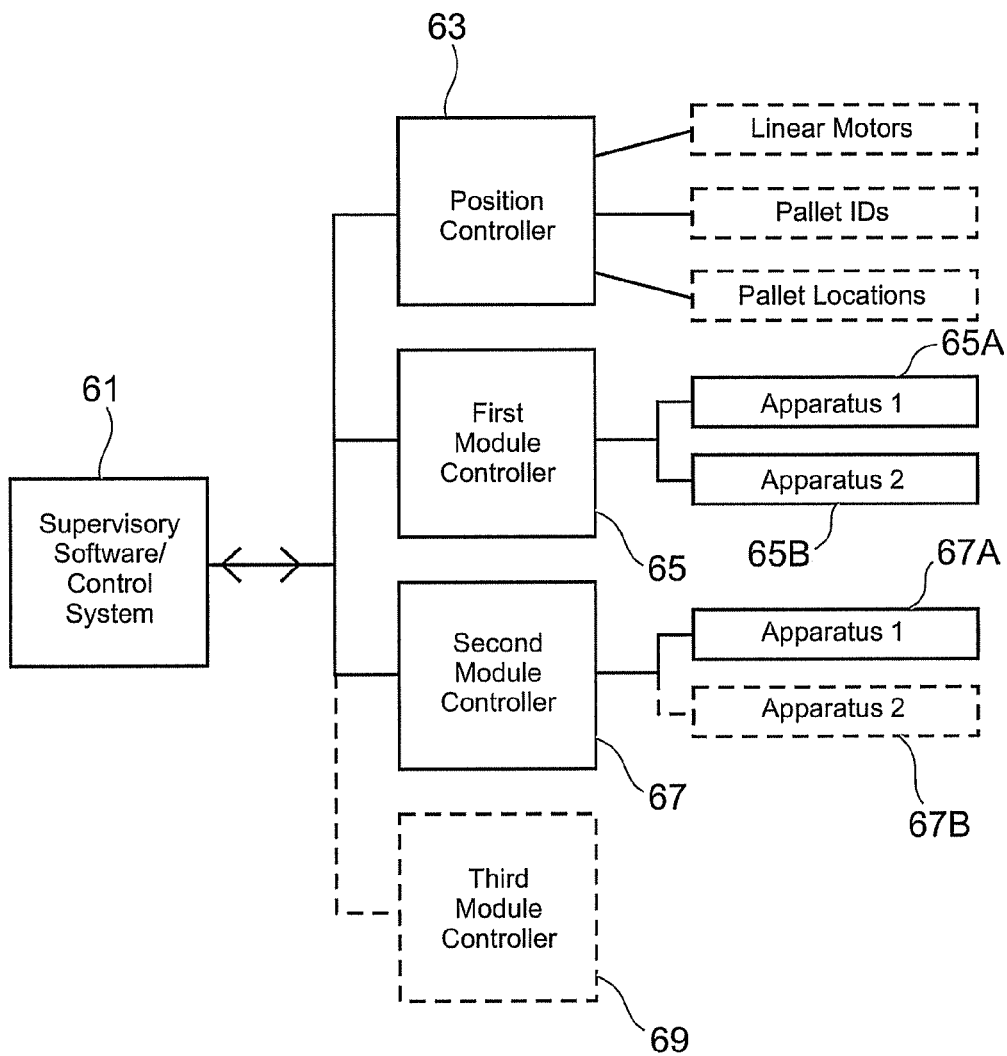
FIG. 7 is a block diagram illustrating components of a control system according to an embodiment of the subject matter described herein.

FIG. 7 is intended to illustrate, by way of a block diagram, various components of a software control system that governs the operation of the system and permits the modular expansion of the hardware system by corresponding modular expansion of the software system.

The software control system, or supervisory software system (61) comprises a number of software modules capable of operating autonomously but which (under the supervisory software system (61)) cooperate to allow the system to perform the desired tasks.

A position controller module (63) governs the movement of the pallets around the system. To do so, the position controller module not only controls the linear motors, but communicates information about the identity and the location of the individual pallets in the system.

The position controller module (63) is configured to control and command each pallet separately to user defined (or automatically determined) stop positions. Parameters such as acceleration, velocity and deceleration are all variable and controllable. One benefit arising from the linear drive employed in the system is that as pallets can move backwards and forwards along the track, this can be used to provide an X-axis control which may reduce the required specifications for the tools (e.g. a two-axis tool may suffice instead of a three-axis tool, because the pallet itself provides movement along the third axis).

An exemplary first module controller (65) comprises two further sub-routines or modules (65A,65B). The first sub-routine controls the operation of a first piece of apparatus mounted on that module, and the second sub-routine controls the operation of a second piece of apparatus mounted on that module. If one or both of the apparatuses are replaced or removed, the corresponding control modules may also be replaced or removed (respectively).

A second module controller (67) comprises one sub-routine or module (67A), which controls the operation of a single piece of apparatus mounted on that module. Should an additional piece of apparatus be mounted on that module, the control system can control that piece of apparatus by addition of another sub-routine or module (67B) which is pre-programmed or adapted to control the apparatus.

Furthermore, an entire new module can be accommodated by similarly adding another module controller (69). In this way, and by adding any relevant sub-routines or modules, individual modules and individual apparatuses/tools can be added and configured to suit new products and/or processes. This unique modular approach to the control software allows the entire system to be configured and reprogrammed "on the fly".

Such modules (e.g. 69) may be pre-programmed within the control system (61). For example, a number of inactive, generic, module controllers may be available—activated as and when a corresponding new module is installed or a new tool or station is installed on an existing module. The generic module (or tool/station) controller, once activated (or immediately prior to activation) may be made to relate to a specific controller. Alternatively, the activated module controller may simply act as an interface between the control system (61) and an external tool or station controller to which commands or operational parameters are conveyed.

In summary of the foregoing description, the system enjoys operational benefits as the pallet transfer system is completely autonomous with respect to stopping positions and pitches whilst maintaining the speed and accuracy normally only expected of precision link index systems.

Standard automated assembly pallet systems operate synchronously with a fixed pitch index to pre-defined fixed positions. This requires design engineers to specify fixed station positions and fixed pitch distance between each index. However, employing the above described linear motor system gives the present invention the unique ability to be programmed with differing and changeable station positions and pitches. One mode of operation which highlights these benefits is when the assembly or test system has single and twin station operations as the pallets can be moved in pairs and/or singly to meet the application needs.

The present invention also provides a user with a system which may be more easily reconfigured than prior art systems because (in practical terms) the pallet stopping positions can be re-programmed or pallet movement mode changed within, say, a few minutes. This allows the system to be re-configured for changes in products and application extremely quickly.

The present invention therefore delivers the unique capability to morph and adapt to different process and application needs without the need to completely redesign or re-build the machine.

The linear drive system employed in the embodiment(s) of the invention described above gives the system the capability to accelerate, move and decelerate a high number of pallets individually and/or concurrently as physical assembly or tests are completed. The supervisory software manages the modular sub routines and relays the status of each station to the position controller, which issues move commands to the linear motor node controller to correctly position the pallets.

The linear drive system in a complete system consists of several linear motors arranged in various linear path lengths. Each linear motor comprises a number of encapsulated linear motor coils. Each linear motor coil can be energised by a range of voltage/current values, generating a varying magnetic field around the motor coil. By means of vernier control of each individual motor coil a moving magnetic field can be transferred not only along the length of an individual linear motor but from one linear motor to the next.

As these linear motors have the unique capability to energise more than one linear motor coil at any time, the linear motor is able to move several pallets over its length independently at any time. As described above, a permanent magnet is fitted to the underside of each pallet; this creates the opposing fixed flux field which the linear motor coils act against. The position of each pallet is detected by an imbedded non-contact linear encoder which runs along the inside edge of the linear motor. The encoder picks up the magnetic field of the permanent magnet imbedded in each pallet. The position of each pallet is reported back to the position controller to establish a feedback/control loop.

The described embodiment consisted of two linear paths (variable in length by the addition of more modules), one running down each side of the system. The pallets are transferred to the linear paths by means of a mechanical return wheel (return wheels located at each end of the machine) and a pressure foot fitted to the rear of each pallet. The linear drive system sends pallets off one path and receives pallets into the next path automatically. Pallets are precision guided around the machine by means of a precision guidance track and four precision guidance bearings.

Real time tracking of pallets between linear paths and the return wheels is monitored by RFID tags fixed to the pallets and RFID tag readers situated at the entry to each of the linear motor paths.

Introduction of new tools or stations is very simple. Access to the machine configuration is by means of an HMI (human machine Interface) touch screen. By choosing the "add a station" icon the user can define a new station position and path. For example, Path 2 position 1.450 mm. The modular supervisory software program associates this new position with an unused slave module. Immediately the new station position and path are inserted, all pallets will now stop exactly at the new defined position until the supervisory software sends a "station complete" signal at which time the pallet will move to the next pre-programmed position. With the addition of each new station, the supervisory software utilises another unused but pre-written module or sub-routine which includes all the necessary communications for a new station to which the operator can later define specific station ladder logic or robotic sub routine for that station or operation.

The same applies when a new module is inserted, or indeed an existing module is removed. The position controller is updated with information that the paths have been altered and recalculates the position along each path at which stops should be made. This determination also takes into account whether any additional tools or stations were/are present and working on the inserted or removed pallet; corresponding sub-routines subsequently created/amended or deleted (respectively). In this way, the system can be expanded or reduced in modular fashion and the control software correspondingly expand or reduce the supervisory software system.

The skilled reader will realise that the benefits and advantages of the present invention are many and varied. The modularity of the system, in terms of enlarging the working area by adding table top sections and adding functionality by integrating additional stations on the table tops themselves, is facilitated both in hardware (as just summarised) and in the supervisory software which governs operation of such a system and enables quick integration using modular units of software. The present invention may employ a wide range of different toolings to suit different applications, including; two to six axis pick and place; laser cutting and drilling; laser, thermal and ultrasonic welding; paper and foil punching; liquid dispensing; adhesive application and curing; testing, sensing and vision inspection; integration with mould unload robots, cartridges, vibratory feed systems and belt conveyors; and micro assemblies.

The foregoing list of applications should not be considered limiting in any way; the skilled person will readily appreciate that one of the advantages of the present invention is that other applications may be accommodated with relative ease.

Throughout the specification, unless the context demands otherwise, the terms 'comprise' or 'include', or variations such as 'comprises' or 'comprising', 'includes' or 'including' will be understood to imply the inclusion of a stated integer or group of integers, but not the exclusion of any other integer or group of integers.

Further modifications and improvements may be added without departing from the scope of the invention herein described. For example, while exemplary embodiments have been described wherein pallets are moved using linear motors, it is also envisaged that other pallet moving systems, such as lead screw systems, may be employed.

What is claimed is:

1. A product assembly, test, packaging and/or processing system comprising:
   at least one pallet on which to locate a product within the system;
   a plurality of modules, each of said modules comprising a work surface upon which to mount one or more product assembly, test, packaging or processing stations; and
   a track on which the at least one pallet is mounted and along which the pallet is moved from one tool to another;
   a first of the modules comprising a first portion of the track and removeably connected to a second module comprising a second portion of the track and the track portions cooperating to allow the at least one pallet to move therebetween and a u-shaped track portion and a mechanical return wheel to interact with a pressure foot fitted to the rear of the at least one pallet and drive the at least one pallet around the u-shaped track portion.

2. The system of claim 1, further comprising a plurality of linear motors and a plurality of pallets, each pallet having a magnet mounted and positioned thereon to interact with the linear motors to form a linear drive which moves the pallets along the track.

3. The system of claim 2, wherein each pallet comprises one or more bearings to aid movement of the pallet along the track.

4. The system of claim 2, wherein each pallet comprises at least two bearings positioned on opposite sides of the track and engaging said opposite sides of the track.

5. The system of claim 2, wherein the system further comprises a position controller to control the position of the plurality of pallets by controlling the interaction between the linear motors and the magnets mounted on said plurality of pallets.

6. The system of claim 1, further comprising one or more lead screw systems to move the at least one pallet.

7. The system of claim 1, wherein each of the one or more pallets comprises a radio frequency identification (RFID) tag.

8. The system of claim 1, wherein the position controller controls the distance between successive pallets to provide a variable pitch width.

9. A product assembly, test, packaging and/or processing system comprising:
- at least one pallet on which to locate a product within the system;
- a plurality of modules, each of said modules comprising a work surface upon which to mount one or more product assembly, test, packaging or processing stations; and
- a track on which the at least one pallet is mounted and along which the pallet is moved from one tool to another;
- a first of the modules comprising a first portion of the track and removeably connected to a second module comprising a second portion of the track and the track portions cooperating to allow the at least one pallet to move therebetween, wherein each of the modules comprises an integrated moveable guard, the integrated moveable guard of each module adapted to cooperate with the integrated moveable guard of an adjoining module to provide the system with a continuous moveable guard.

10. The system of claim 9, wherein the continuous moveable guard or any one of the integrated moveable guards is automatically locked in a closed position when the system is in operation.

11. The system of claim 9, wherein each of the integrated moveable guards comprise a gull-wing door.

12. The system of claim 9, further comprising a plurality of linear motors and a plurality of pallets, each pallet having a magnet mounted and positioned thereon to interact with the linear motors to form a linear drive which moves the pallets along the track.

13. The system of claim 12, wherein each pallet comprises one or more bearings to aid movement of the pallet along the track.

14. The system of claim 12, wherein each pallet comprises at least two bearings positioned on opposite sides of the track and engaging said opposite sides of the track.

15. The system of claim 12, wherein the system further comprises a position controller to control the position of the plurality of pallets by controlling the interaction between the linear motors and the magnets mounted on said plurality of pallets.

16. The system of claim 9, further comprising one or more lead screw systems to move the at least one pallet.

17. The system of claim 9, wherein each of the one or more pallets comprises a radio frequency identification (RFID) tag.

18. The system of claim 9, wherein the position controller controls the distance between successive pallets to provide a variable pitch width.

* * * * *